Oct. 22, 1963 W. S. LEVIN 3,108,197

FEEDBACK CONTROL LOGARITHMIC AMPLIFIER

Filed Feb. 16, 1961

INVENTOR.
WILLIAM S. LEVIN

BY

H. H. Losche
ATTORNEYS

United States Patent Office 3,108,197
Patented Oct. 22, 1963

3,108,197
FEEDBACK CONTROL LOGARITHMIC AMPLIFIER

William S. Levin, Hyattsville, Md., assignor, by mesne assignments, to the United States of America as represented by the Secretary of the Navy
Filed Feb. 16, 1961, Ser. No. 89,891
3 Claims. (Cl. 307—88.5)

Figures 1, 2:
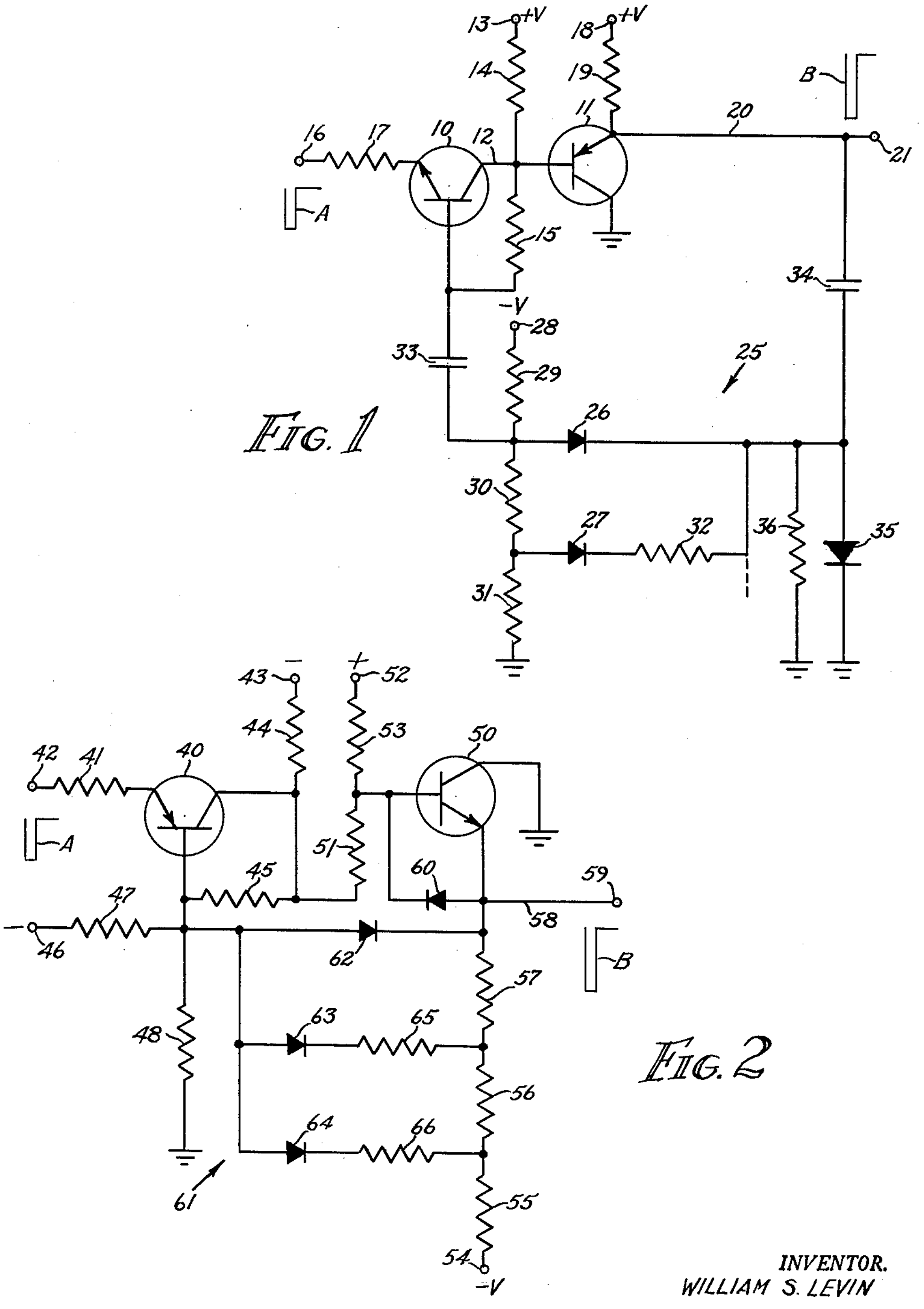

This invention relates to logarithmic amplifiers and more particularly to amplifiers having a shaping feedback circuit to control the gain of the amplifier to produce an amplified output signal which represents substantially the logarithm of the input signal.

Logarithmic amplifiers find use in the compression of a wide signal range, in analog computers, and in the amplification of video signals to decrease the gain to lower decibel values. Such amplifiers are produced by utilizing some element which has a logarithmic voltage-current characteristic. Probably the most common example of this is the use of thermionic elements which have the inherent disadvantage of "matching" for replacement purposes to obtain the original logarithmic characteristics of the amplifier. Another well known logarithmic amplifier utilizes an RC decay to produce a logarithmic response which avoids, to a great extent, the troublesome variation with change or replacement of components. In all of these known logarithmic amplifiers, shaping networks or other nonlinear networks are used in combination with the amplifier stages to produce the amplified logarithmic function.

In the present invention a transistor amplifier of several stages is used having in each stage a pair of collector-to-base coupled transistors with an input coupled to the emitter of the first and the output coupled to the emitter of the second of this transistor amplifier combination. A feedback circuit is coupled from the output of the second transistor to the base of the first transistor which feedback includes a plurality of diodes, each of which are biased at a different voltage level to cause successive conduction in a progressive manner as the voltage amplitude on the output changes to feed back voltage signals in a progressive manner to produce a substantially logarithmic amplification of input signal. In one modification the fedeback circuit is coupled through coupling capacitors and in a second modification of the invention the feedback circuit is rearranged to eliminate the coupling capacitors to avoid signal over-shoot. It is therefore a general object of this invention to produce a stage of logarithmic amplification through the use of a diode feedback circuit to produce feedback signal shaping to control the amplifier for logarithmic amplification.

This general object and other objects will become more apparent to those skilled in the art as the description proceeds when considering the modifications showing preferred forms of the invention in the drawing, in which:

FIGURE 1 illustrates in a circuit schematic diagram one form of the logarithmic amplifier, and FIGURE 2 illustrates another modification of the logarithmic amplifier in circuit schematic diagram.

Referring more particularly to FIGURE 1, a transistor amplifier 10 has its collector directly coupled to a transistor emitter follower 11 by way of the conductor 12. This collector and base of the transistors 10 and 11 are biased from a positive voltage source applied at terminal 13 through a resistor 14, and the base of transistor 10 is further biased from this source through the resistor 15. The emitter of transistor 10 is coupled to an input terminal 16 through a resistor 17. The transistor 11 has a positive voltage applied from a terminal 18 through a resistor 19 to the emitter, and the collector of this transistor is coupled directly to a fixed or zero potential such as ground. The emitter of transistor 11 is also coupled through an output conductor 20 to an output terminal 21.

A feedback circuit 25 couples the emitter of transistor 11 to the base of transistor 10 through a nonlinear or shaping network consisting of two or more diodes in parallel, only two of which are shown for the purpose of illustration in this embodiment, these diodes being identified herein by the reference characters 26 and 27. The diodes 26 and 27 are back biased from a terminal 28 to which a negative voltage is applied through a voltage divider circuit consisting of resistors 29, 30, and 31 to the fixed or zero potential such as ground. In series with the diode 27 in its parallel path with the diode 26 is a current limiting resistor 32. The feedback circuit 25 is coupled through coupling capacitors 33 and 34 to block direct current voltages between the amplifier and feedback circuit. A protective diode 35 couples the juncture of the coupling capacitor 34 and the parallel diode network 26, 27, and the zero or fixed potential such as ground, this protective diode being oriented in this illustration in a direction to clamp all positive going voltage swings at zero potential. This protective diode 35 is coupled in parallel with a resistance 36 to maintain the voltage on the right hand end of the parallel diode network at zero potential. The diodes 26 and 27 are oriented with the anodes coupled to the voltage divider circuit 29—31 and the cathodes thereof coupled to the coupling capacitor 34 to operate only in this illustration with negative feedback signals. It is to be understood that the diodes, the transistors, and the applied voltages may be rearranged in a manner well understood by those skilled in the art to handle positive voltage signals as well as the negative voltage signals herein.

Purely by way of example to give one particular operative illustration of FIGURE 1, the following values for the various elements are stated which, it is to be understood, are not in any way to limit the invention to these particular values:

| | |
|---|---|
| Transistors— | Types |
| **10** | 2N696 |
| **11** | 2N509 |
| Diodes— | Types |
| **26** | 1N270 |
| **27** | 1N270 |
| **35** | 1N270 |
| Voltages— | Values, volts |
| Terminal **13** | 15 |
| Terminal **18** | 30 |
| Terminal **28** | —6 |
| Capacitors— | Values, mf. |
| **33** | .02 |
| **34** | .25 |
| Resistors— | Values, ohms |
| **14** | 1K |
| **15** | 220K |
| **17** | 12 |
| **19** | 15K |
| **29** | 3.6K |
| **30** | 240 |
| **31** | 820 |
| **32** | 2K |
| **36** | 100K |

In the operation of the device shown in FIGURE 1, let it be assumed that terminal 16 is coupled to a source of negative voltage signals, such as A, to be amplified. Amplification will take place in the transistor amplifier 10 and this amplified voltage signal will result on the output conductor 20 to the output terminal as an amplified negative voltage signal B from the emitter follower transistor 11. The output signal B is applied through the coupling capacitor 34 to the feedback circuit 25. As the negative voltage signal B proceeds in the negative direction, the diode having the lowest anode bias will be the first to conduct feedback voltage through the coupling capacitor 33 to the base of transistor 10. As the amplified negative voltage signal B progresses further in its negative swing, the next higher biased diode will produce conduction through the base of transistor 10. In the illustration shown in FIGURE 1, diodes 27 and 26 will conduct in this sequence to apply the negative voltages in response to their bias to the base of transistor 10 through the coupling capacitor 33 to progressively decrease the gain of the transistor amplifier 10 of the signal A to be amplified. This produces a negative feedback since the action of the feedback pulse to the base of transistor 10 is in opposition to the effect of the signal A applied to the emitter of this transistor. Diodes 26 and 27 should be of the high conductance type to insure a low forward resistance and a low current through the transistors 10 and 11. Any tendency of the amplified output voltage signal B to swing in the positive direction will be clamped by the diode 35. While two diodes 26 and 27 are shown and described herein to produce negative feedback to control the transistor amplifier 10 to produce logarithmic amplification of signals such as A, it is to be understood that additional diodes as 26 and 27 with a progressively changing back bias thereon could more accurately produce logarithmic amplification.

Referring more particularly to FIGURE 2, a schematic circuit diagram is shown in which the feedback circuit is coupled directly to the transistor amplifier circuit without the use of coupling capacitors to avoid overshoot ordinarily produced by capacitor coupling. In this illustration a transistor amplifier 40 has its emitter coupled through a resistor 41 to an input terminal 42 to which negative input signals A may be applied. The collector supply voltage is applied from a terminal 43 to which a negative voltage is applied through a load resistor 44 and the base of this transistor 40 is biased from the same source through a resistor 45. The base of transistor 40 is likewise coupled to a voltage divider circuit between a negative voltage source and ground applied at terminal 46 through resistors 47 and 48. The collector of transistor 40 is coupled to the base of an emitter follower transistor 50 through a resistor 51, this base being biased from a positive voltage source applied at terminal 52 through the resistor 53. The emitter and collector of transistor 50 have a voltage applied across these terminals from a negative voltage source applied at terminal 54 through resistors 55, 56, and 57, to the emitter, the collector being coupled directly to a zero or ground source. The emitter of transistor 50 is likewise coupled through a conductor 58 to an output terminal 59. The emitter and base are coupled through a protective diode 60 oriented with the anode thereof coupled to the emitter and the cathode thereof coupled to the base.

The feedback circuit generally referred to by the reference character 61 consists of a plurality of diodes 62, 63, and 64, illustrated herein as being coupled in parallel from the emitter of transistor 50 to the base of transistor 40. The diodes 62 through 64 are coupled in parallel with their anodes connected to the base of transistor 40 and their cathodes coupled to the emitter of transistor 50. Diode 63 has a current limiting resistor 65 coupled between its cathode and the junction of the resistances 56 and 57, and the diode 64 has its cathode coupled through a current limiting resistor 66 to the junction of resistors 55 and 56. As in FIGURE 1, any voltage signal, as A, applied to the terminal 42 will be amplified in logarithmic function to produce the negative voltage signal B at the output terminal 59.

As an aid in understanding the operation of this embodiment of the invention the following values and types will be assigned to the various elements purely for the purpose of example without anly intention of limiting the invention to these values or types:

| Transistors— | Types |
|---|---|
| 40 | 2N384 |
| 50 | 2N696 |

| Voltages— | Values, volts |
|---|---|
| Terminal 43 | −30 |
| Terminal 46 | −30 |
| Terminal 52 | +45 |
| Terminal 54 | −30 |

| Resistors— | Values, ohms |
|---|---|
| 41 | 51 |
| 44 | 2K |
| 45 | 150K |
| 47 | 6.2K |
| 48 | 1.8K |
| 51 | 3K |
| 53 | 24K |
| 55 | 2.7K |
| 56 | 56 |
| 57 | 30 |
| 65 | 1K |
| 66 | 2K |

The operation of the embodiment illustrated in FIGURE 2 is substantially the same as that described for FIGURE 1 in which a negative voltage signal, as A, applied to the transistor amplifier 40 will produce on the emitter follower output of transistor 50 the amplified negative voltage signal B. Any tendency of the emitter voltage of transistor 50 to become positive with respect to its base will cause direct coupling by virtue of the protective diode 60. The diodes in the feedback circuit 61 having the lesser bias will conduct first such that the diode 62, 63, and 64 will conduct progressively in that order as the amplified signal B progresses in the negative going direction. This progressive conduction through the feedback circuit 61 to the base of the transistor 40 will progressively decrease the gain of this transistor amplifier 40 approximating that of producing an output signal B which is the logarithmic function of the input signal A. Also, as discussed in the description of FIGURE 1, the number of diodes in the feedback circuit in this embodiment could be increased to more accurately approach the logarithmic function. It is also to be understood that the transistors and the diodes could be rearranged and the polarities changed to handle positive going signal voltages in the same manner as negative going signal voltages have been handled in the embodiment illustrated herein without departing from the spirit and scope of this invention, it being understood that such circuit changes are within the knowledge of those skilled in the art.

While many modifications and changes may be made in the constructional features and details of the two preferred embodiments shown and described herein, as by rearranging the N-P-N and P-N-P type transistors and diodes to handle different polarity signals, it is to be understood that I desire to be limited only in the spirit and scope of this invention by the appended claims herein.

I claim:

1. A feedback controlled logarithmic amplifier stage comprising:

a transistor amplifier circuit including first and second transistors, each having emitter, collector, and base electrode, said first transistor being collector-to-base coupled to said second transistor, the emitter of the first transistor being coupled to an input terminal and the emitter of the second transistor being coupled to an output terminal, the collector-to-base coupling and the base of the first transistor being coupled in a voltage divider circuit and the collector of said second transistor being coupled to fixed zero potential;

a negative feedback circuit coupling the output terminal of the second transistor to the base of said first transistor, said feedback circuit including a plurality of diodes in parallel and each biased at a different voltage level within the range of voltage of said output to feed back negative output signals in progressive voltage steps in accordance with the amplitude of the amplified signal to progressively decrease the gain of the amplifier; and diode limiting means coupled to said output terminal to limit the positive voltage of output signals whereby the closed loop gain decreases as the feedback voltage steps progress to produce amplification logarithmically.

2. A feedback controlled logarithmic amplifier as set forth in claim 1 wherein said first transistor is an N-P-N type and the second transistor is a P-N-P type with the diode limiting means including a diode having an anode and a cathode and having its anode coupling said output terminal and its cathode coupling a fixed zero potential.

3. A feedback controlled logarithmic amplifier as set forth in claim 1 wherein said first transistor is a P-N-P type and said second transistor is an N-P-N type with said diode limiting means including a diode having an anode and a cathode and having its anode coupling said output terminal and its cathode coupling the base of said second transistor.

References Cited in the file of this patent

UNITED STATES PATENTS

| | | |
|---|---|---|
| 2,760,008 | Schade | Aug. 21, 1956 |
| 2,774,825 | Sherr | Dec. 18, 1956 |
| 2,802,118 | Simkins | Aug. 6, 1957 |
| 2,863,955 | Keonjian | Dec. 9, 1958 |
| 2,906,933 | Magnin | Sept. 29, 1959 |
| 2,912,654 | Hansen | Nov. 10, 1959 |

FOREIGN PATENTS

| | | |
|---|---|---|
| 1,094,807 | Germany | Dec. 15, 1960 |